(12) United States Patent
Chia et al.

(10) Patent No.: US 11,778,771 B2
(45) Date of Patent: Oct. 3, 2023

(54) AIRFLOW CONTROL LOUVER FOR BIDIRECTIONAL AIRFLOW COOLING

(71) Applicant: Cisco Technology, Inc., San Jose, CA (US)

(72) Inventors: Vic Hong Chia, Sunnyvale, CA (US); Wei Qi, Shanghai (CN); Yong Hong Luo, Shanghai (CN); Hua Yang, Tracy, CA (US)

(73) Assignee: Cisco Technology, Inc., San Jose, CA (US)

( * ) Notice: Subject to any disclaimer, the term of this patent is extended or adjusted under 35 U.S.C. 154(b) by 22 days.

(21) Appl. No.: 17/454,571

(22) Filed: Nov. 11, 2021

(65) Prior Publication Data
US 2023/0148257 A1  May 11, 2023

(51) Int. Cl.
*H05K 7/20* (2006.01)

(52) U.S. Cl.
CPC ....... *H05K 7/20145* (2013.01); *H05K 7/2039* (2013.01); *H05K 7/20736* (2013.01)

(58) Field of Classification Search
CPC ............ H05K 7/20145; H05K 7/2039; H05K 7/20181; H05K 7/20172; H05K 7/20736; H05K 7/20136; H05K 7/20163; H05K 7/20618; G06F 1/206; G06F 1/20; F04D 25/14; F04D 29/703; F04D 29/646; F24F 13/10; F24F 2221/36; F24F 2140/40; G02B 6/4269
See application file for complete search history.

(56) References Cited

U.S. PATENT DOCUMENTS

| | | | |
|---|---|---|---|
| 5,563,768 A | 10/1996 | Perdue | |
| 6,678,157 B1 * | 1/2004 | Bestwick | H05K 7/20163 165/104.34 |
| 7,262,964 B1 | 8/2007 | Barsun | |
| 7,432,441 B2 * | 10/2008 | Liang | H05K 7/1411 361/676 |
| 7,535,709 B2 * | 5/2009 | Fan | G06F 1/20 174/16.3 |
| 8,068,338 B1 | 11/2011 | Tamarkin | |
| 8,422,227 B2 * | 4/2013 | Lai | H05K 7/20727 361/695 |
| 8,913,385 B2 * | 12/2014 | Downing | H01L 23/467 361/679.48 |
| 8,950,726 B2 * | 2/2015 | Sun | F04D 25/14 415/213.1 |
| 9,655,284 B2 * | 5/2017 | Milligan | H05K 7/20736 |
| 10,054,993 B2 * | 8/2018 | Yi | H05K 7/20154 |
| 10,321,608 B1 * | 6/2019 | Beall | H05K 7/20736 |
| 2002/0145853 A1 * | 10/2002 | Grouell | H05K 7/2019 361/695 |
| 2003/0224717 A1 * | 12/2003 | Tsai | H05K 7/2019 454/184 |
| 2005/0195568 A1 * | 9/2005 | Shyr | G06F 1/20 361/695 |

(Continued)

*Primary Examiner* — Michael A Matey
(74) *Attorney, Agent, or Firm* — Patterson + Sheridan, LLP

(57) ABSTRACT

Embodiments for providing cooling airflow through electronic in two different directions is described. An airflow control louver system in an electronic device provides for cooling airflow to be efficiently routed through the electronic device in the two different directions which in turn allows for multiple installation configurations for electronic devices with high powered heat sensitive components.

20 Claims, 7 Drawing Sheets

(56) References Cited

U.S. PATENT DOCUMENTS

| | | | |
|---|---|---|---|
| 2005/0241810 A1* | 11/2005 | Malone | F04D 25/166 |
| | | | 165/122 |
| 2008/0145246 A1* | 6/2008 | Lee | F04D 25/14 |
| | | | 417/423.14 |
| 2009/0154114 A1* | 6/2009 | Peng | G06F 1/182 |
| | | | 361/728 |
| 2009/0237882 A1 | 9/2009 | Lin et al. | |
| 2011/0228477 A1* | 9/2011 | Hong | H05K 7/20181 |
| | | | 165/96 |
| 2011/0235272 A1* | 9/2011 | Bash | H05K 7/20727 |
| | | | 361/692 |
| 2012/0133255 A1* | 5/2012 | Izu | H05K 7/20727 |
| | | | 312/236 |
| 2012/0138262 A1* | 6/2012 | Zhang | F04D 29/601 |
| | | | 165/67 |
| 2014/0118924 A1* | 5/2014 | Magarelli | G06F 1/206 |
| | | | 361/679.46 |
| 2014/0211419 A1* | 7/2014 | Liao | H05K 7/20181 |
| | | | 361/695 |
| 2015/0237768 A1* | 8/2015 | Endo | H05K 7/20754 |
| | | | 361/679.49 |
| 2018/0077819 A1* | 3/2018 | Roy | H05K 7/20745 |
| 2020/0116385 A1* | 4/2020 | Tsai | F04D 25/166 |

\* cited by examiner

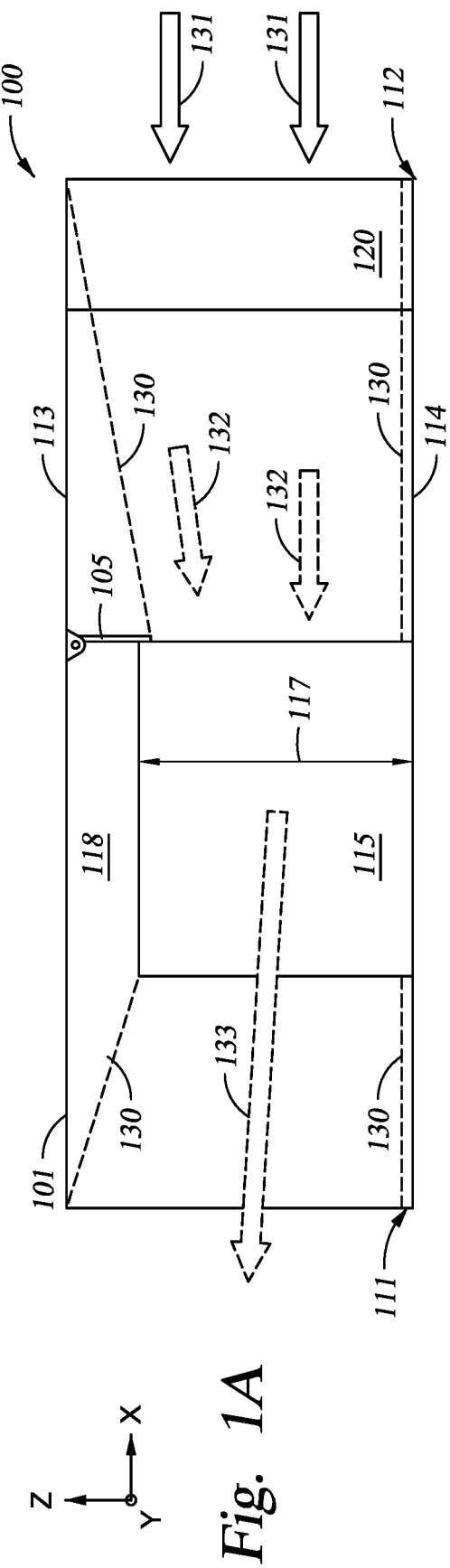
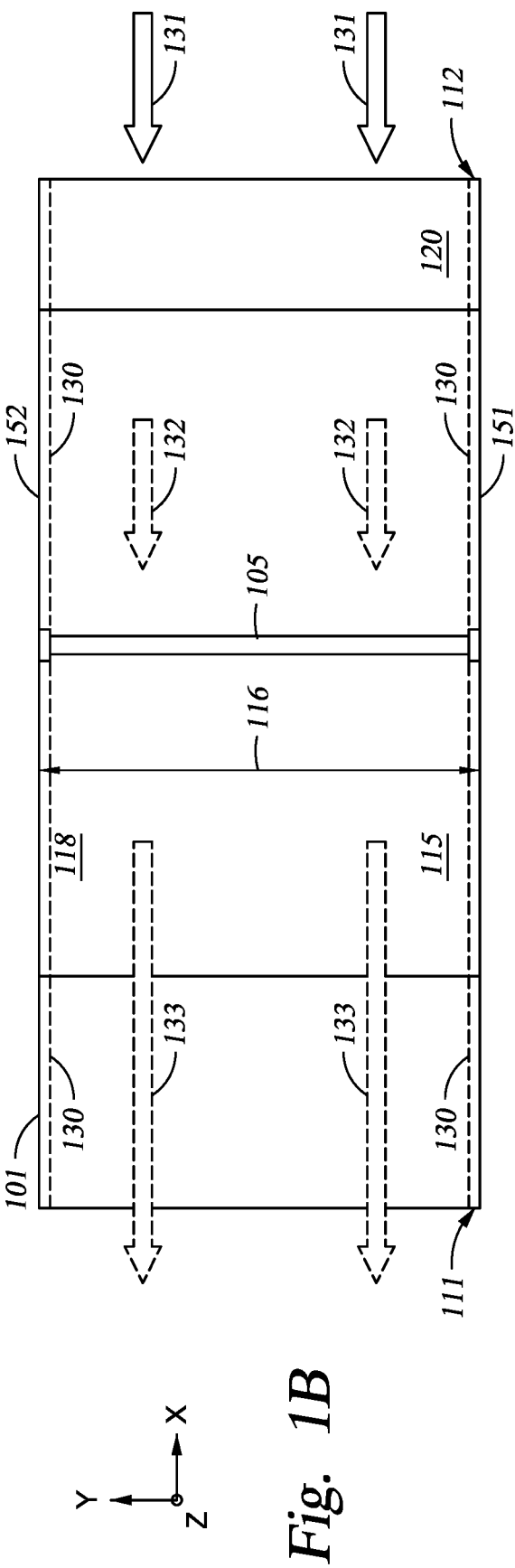
Fig. 1A
Fig. 1B

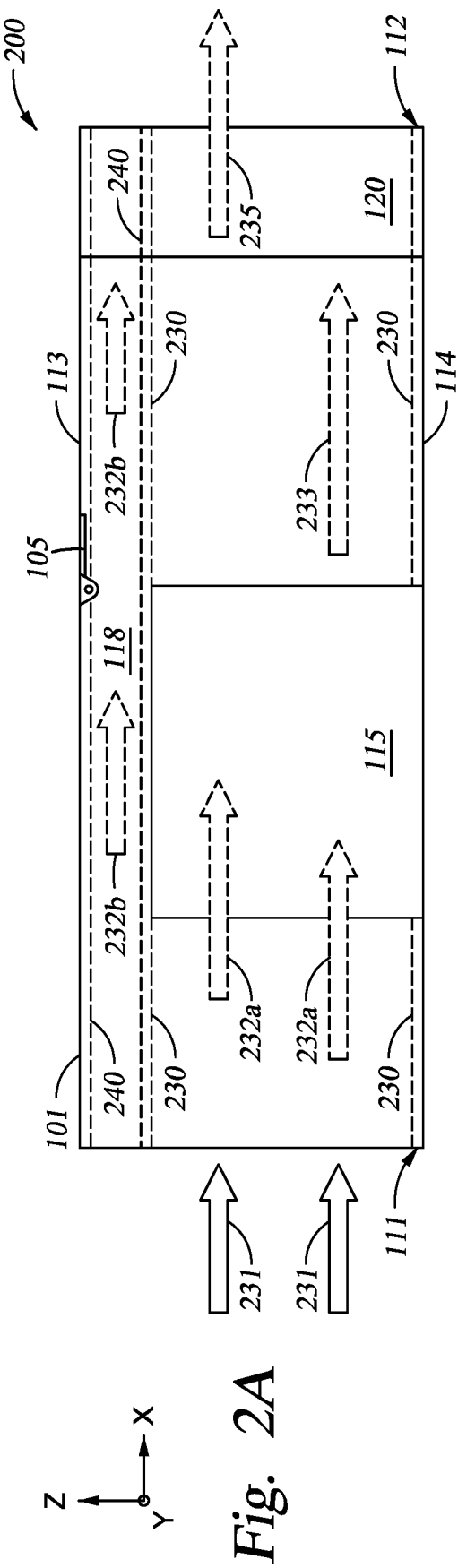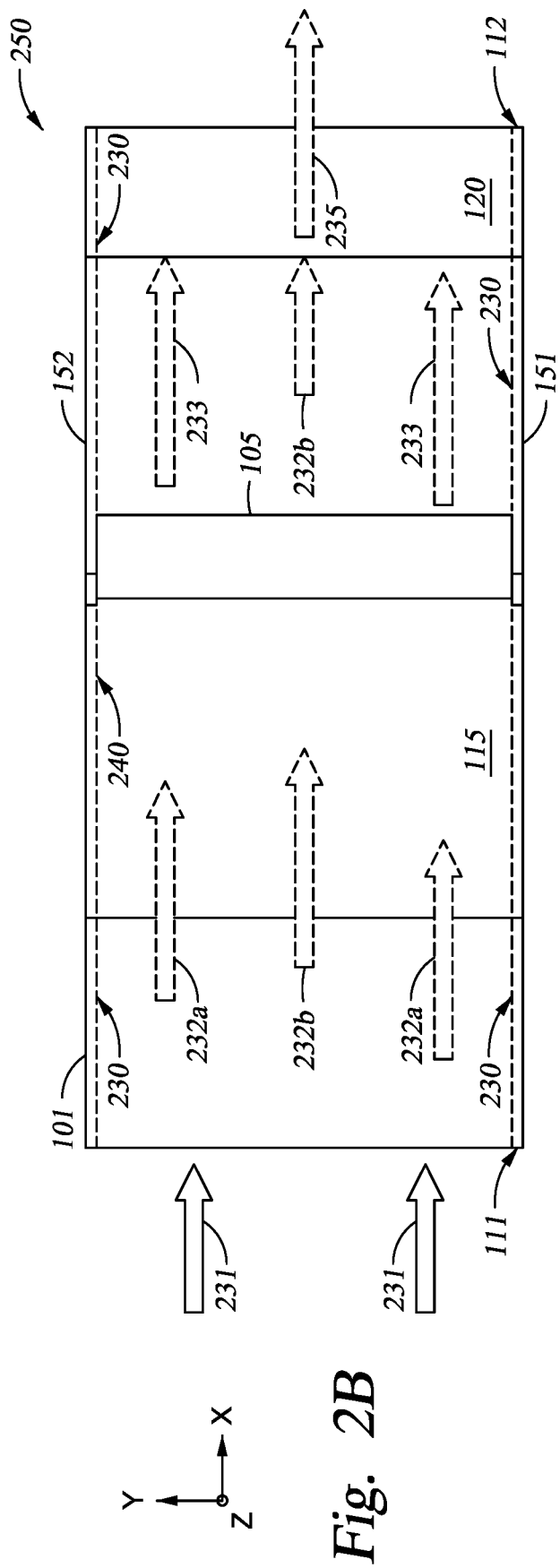

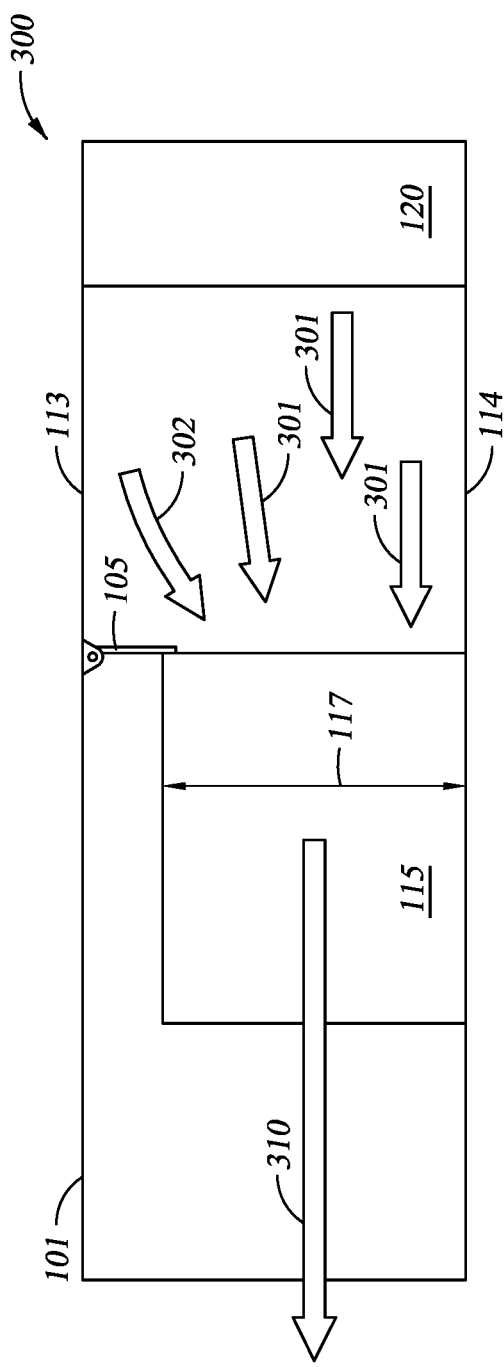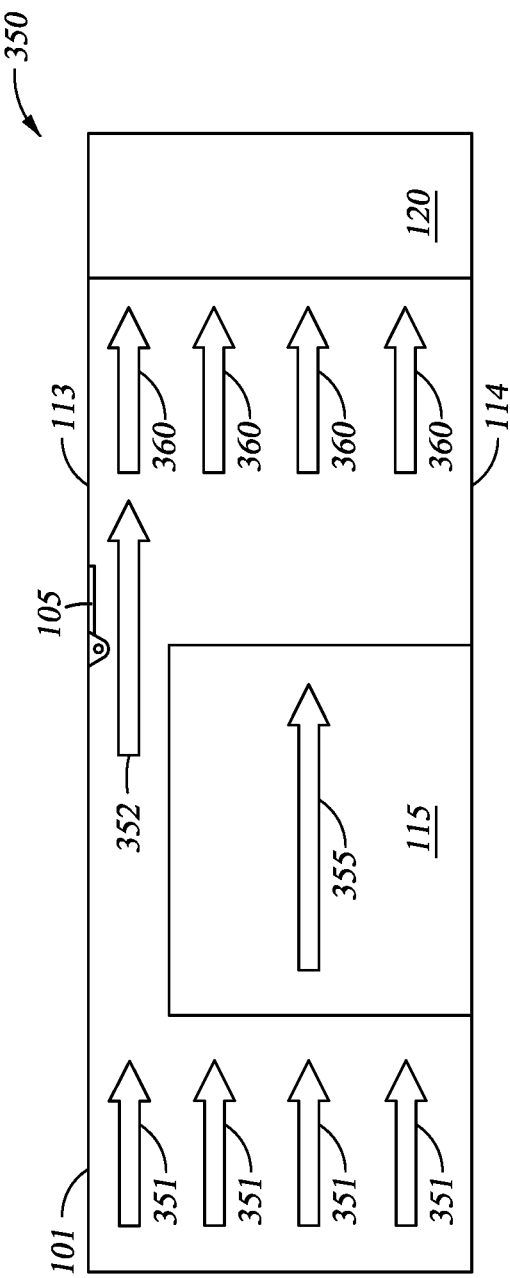
Fig. 3A
Fig. 3B

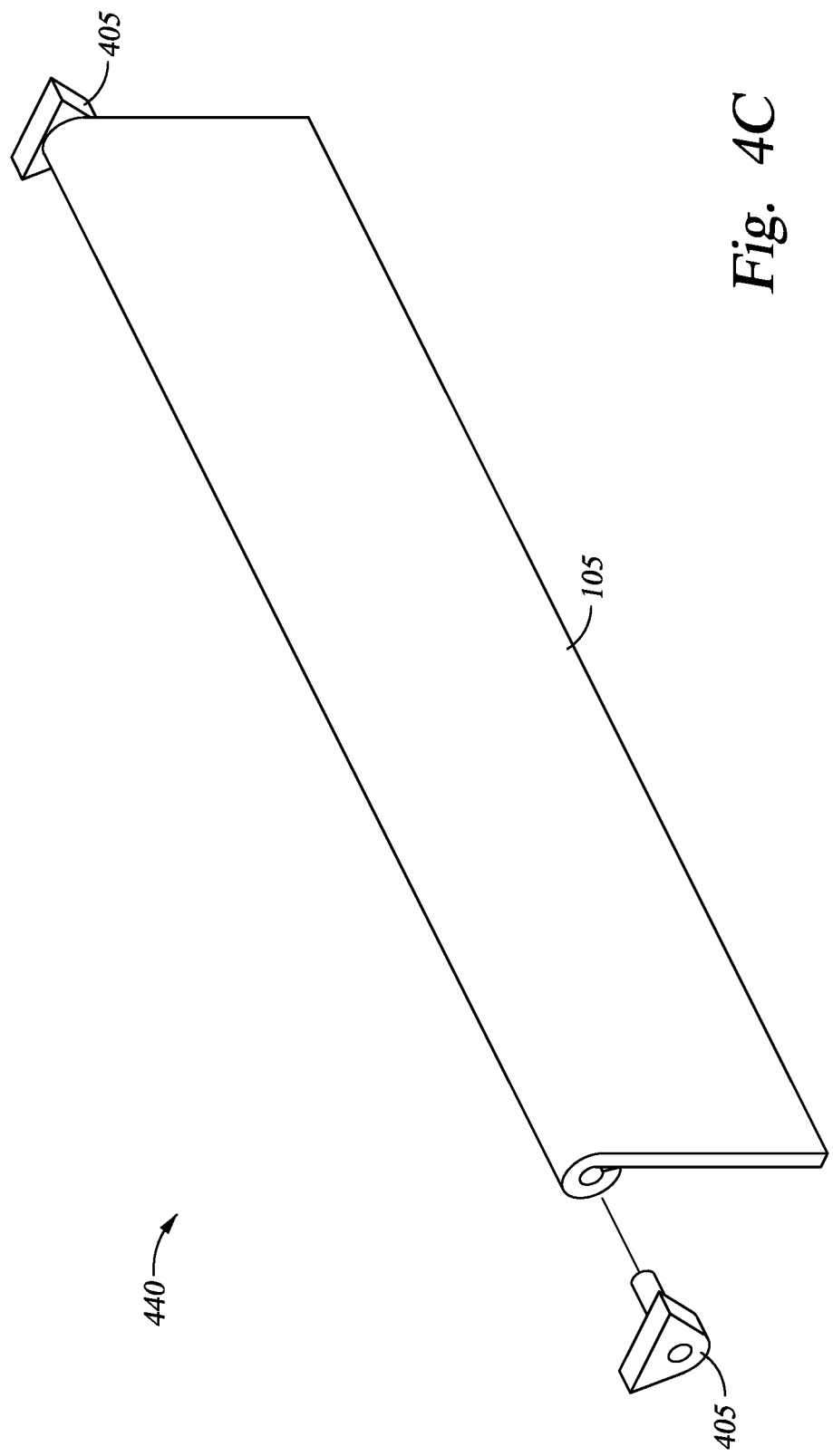

AIRFLOW CONTROL LOUVER FOR BIDIRECTIONAL AIRFLOW COOLING

TECHNICAL FIELD

Embodiments presented in this disclosure generally relate to providing airflow and cooling in and through computer systems such as data center switches and storage systems. More specifically, embodiments disclosed herein describe a dynamic airflow control louver system which provides for efficient and effective cooling for computing systems, where the computing systems may be installed within mounting equipment in various configurations.

BACKGROUND

In large scale computing environments, such as data centers, flexibility in installing and replacing computer systems and other electronic components is a key design requirement. This flexibility and versatility allows for quick and simple replacements and upgrades of computer systems. For example, individual systems installed within a large scale networked system may break down or require hardware technology upgrades. In order to allow operators of the computer systems to access, upgrade, repair, and replace these systems the computer systems are designed with several optional installation configurations within the overall mounting equipment.

Additionally, as computer systems increase in power and complexity, the heat output of these systems also increases. While some design improvements to these higher powered systems provide for efficient cooling, these improvements often eliminate flexible and efficient installation within large scale computing environments. Providing efficient cooling to increasingly high power computer systems, without sacrificing flexible installation and configuration, remains a challenge.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate typical embodiments and are therefore not to be considered limiting; other equally effective embodiments are contemplated.

FIGS. 1A and 1B illustrate an electronic device with an airflow control louver in a first position, according to one embodiment.

FIGS. 2A and 2B illustrate an electronic device with an airflow control louver in a second position, according to one embodiment.

FIGS. 3A and 3B illustrate additional views of the airflow control louver, according to embodiments.

FIGS. 4A-4C illustrate a mounted airflow control louver, according to embodiments.

To facilitate understanding, identical reference numerals have been used, where possible, to designate identical elements that are common to the figures. It is contemplated that elements disclosed in one embodiment may be beneficially used in other embodiments without specific recitation.

DESCRIPTION OF EXAMPLE EMBODIMENTS

Overview

Figure 4A:
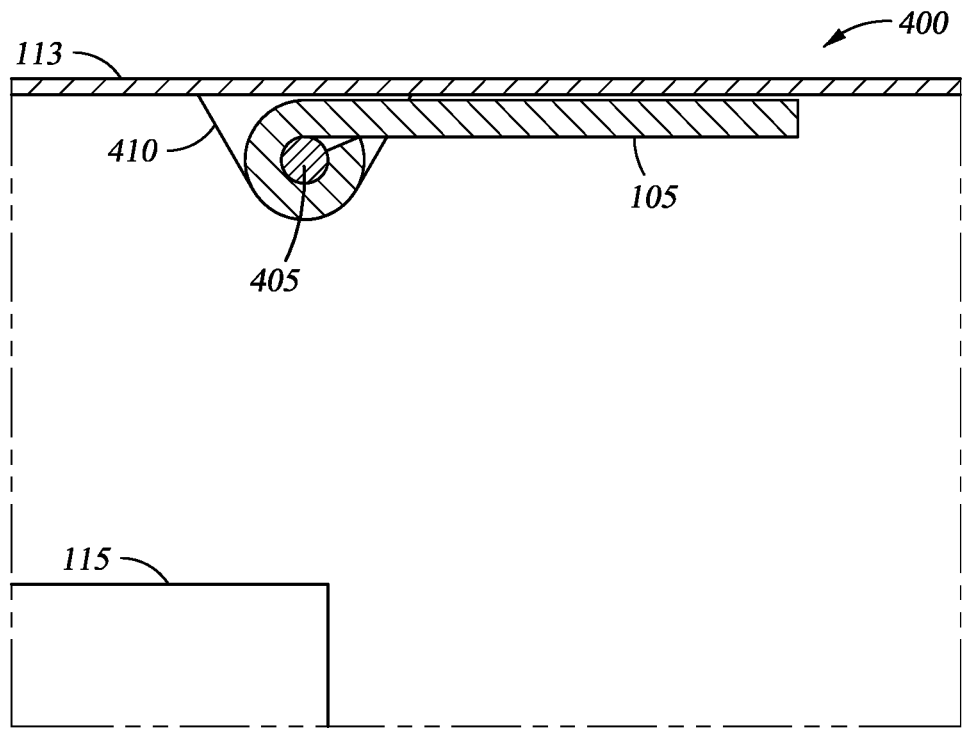

One example embodiment includes an electronic device. The electronic device includes a heatsink; a first airflow path in a first direction, where the first airflow path passes through the heatsink; a second airflow path in a second direction, where the first airflow path passes through the heatsink; and a third airflow path in the second direction, where the third airflow path bypasses the heatsink. The electronic device also include an airflow control louver, where the airflow control louver in a first position directs cooling air along the first airflow path, and where the airflow control louver in a second position allows cooling air to flow along the second airflow path and the third airflow path.

Another example embodiment includes a network switch. The network switch includes a heatsink, at least one optical network component and a first airflow path in first direction, a second airflow path and a third airflow path in a second direction. The first airflow path passes through the heatsink, the first airflow path passes through the heatsink, and the third airflow path bypasses the heatsink to flow to the at least one optical network component. The network switch also include an airflow control louver, where the airflow control louver in a first position directs cooling air along the first airflow path, and where the airflow control louver in a second position allows cooling air to flow along the second airflow path and the third airflow path.

Another example embodiment includes an airflow control louver system. The airflow control louver system includes an airflow control louver positioned within an enclosed electronic device; a first airflow path in a first direction; a second airflow path in a second direction; and a third airflow path in the second direction, where the airflow control louver in a first position directs cooling air along the first airflow path, and where the airflow control louver in a second position allows cooling air to flow along the second airflow path and the third airflow path.

Example Embodiments

Large scale computer systems are an increasingly utilized form of providing networked computing and storage solutions. For example, large scale data centers provide both primary and redundant computing and storage options for a variety of services including governmental, commercial, and consumer computer network based services. While some data centers and large scale computer systems provide single services on uniform computer equipment, modern data centers increasingly rely on basic standard equipment and allow for customized computer systems. For example, a data center may utilize standard floorplan layouts and equipment racks, while allowing a wide variety of computer systems to be installed within those equipment racks. For example, a standard rack may hold several different types of computer equipment including network switches, storage drives, etc. This wide variety of computer systems allows data center customers/administrators to implement replacements and upgrades with ease while maintaining service. Customers have come to rely on flexibility both in the types of equipment as well as the flexibility of installation options within the racks/equipment of the data center.

One example of flexible installation is whether a computer system or network switch is installed with the ports (or other types of system connections) of the switch facing a cool air aisle in a data center or a hot air aisle in the data center. For example, an operator may install a network switch in a port side intake (PSI) or port side exhaust (PSE) configuration based on the needs of the individual or overall networked system. In some cases, such as the PSE installation, additional cooling air is needed in the individual network switch or electronic device to ensure that the heat sensitive components within the switch receive an adequate cooling airflow.

Indeed, a primary concern for data centers and large scale computer systems is providing efficient cooling to these systems. Failing to keep the individual computer systems cool can cause decreased performance and damage to the computer systems. In some examples, data centers are designed to provide cooling airflow to each of the equipment racks and the individual computer systems. The individual computer systems in turn include cooling systems, such as fans, which move cooler ambient air through the computer system to cool the heat producing internal components of the computer system.

As the processing power of these individual computer systems increases, the cooling needs also increase to keep the systems functioning properly. In some cases, heat sensitive components within the computer system require cool airflow that can cool both the system in general, but also provide cooling airflow to specific heat sensitive components within the system. The systems described herein provide an electronic device with an airflow control louver which provides for cooling airflow to be efficiently routed through the electronic device in two different directions, which in turn allows for multiple installation configurations for electronic devices with high powered heat sensitive components.

FIGS. 1A and 1B illustrate an electronic device, device 101, with an airflow control louver system, including a louver 105, in a first position, and FIGS. 2A and 2B illustrate the device 101 with the louver 105 in a second position. The device 101 may be embodied as a network switch or type of electronic device. FIG. 1A is a side view 100 of the device 101 and FIG. 1B is a top view 150 of the device 101. In some examples, the device 101, as shown in FIG. 1A, is installed within a server rack in a port side air intake or PSI configuration, where cooling air is drawn into the device 101 via the port side of the device 101 as described in more detail in relation to FIG. 6. The PSI configuration provides a cooling flow to a port side of the device 101, side 112, which in turn provides a cooling airflow to heat sensitive components, components 120, in the device 101 before the cooling airflow flows to a heatsink 115 for the device 101.

In some examples, the device 101 is an enclosed chassis which includes the side 112, a bottom side 114, a top side 113, and a side 111, where side 111 is an opposite side to the side 112, as well as sidewall 152, and sidewall 152 forming the enclosed chassis. In some examples, the side 111 is an exhaust side when the airflow control louver is in the first position. In the PSI configuration, cooling air 131 enters the device 101 via an air intake on the port side of the device 101, side 112, and travels along a first airflow path, path 130, through the components 120 in a first direction.

In some examples, the components 120 include ports, optical connections, communication devices (e.g., retimers), application-specific integrated circuits (ASICs) and other heat sensitive electronic or communication components. While a heatsink 115 in the device 101 may provide some cooling capacity to these components, in one embodiment the primary cooling provided these components is via the ambient cooling air, i.e. heat dissipates from the components 120 to the cooling air 131. This heat transfer allows for the components 120 to function properly even as the power and heat generation from the components 120 increases. The cooling air 132 on a downstream side of the components 120 has a higher ambient air temperature than the cooling air 131 due to the heat transfer from the components 120.

In order to maximize cooling efficiency in the device 101 an amount of cooling airflow passing through the heatsink 115 should also be maximized. The louver 105 is positioned in the device 101 to direct the cooling airflow along the path 130 including directing substantially all of the cooling air 132 into the heatsink 115. In some examples, the heatsink 115 provides the cooling capacity and temperature regulation for the main ASIC and other internal electronic components in the device 101.

In this example, the louver 105 is attached to the top side 113 of the device 101. The airflow control louver may also function as a passive activation louver such that at a time when there is no airflow through the device 101, gravitational forces act on the louver 105 to position the louver in the first position as shown in FIGS. 1A-1B. The louver 105, in the first position, also makes contact with a heatsink 115 in the device 101. A width 116 of the heatsink 115 is illustrated in FIG. 1B. In some examples, the width 116 is approximately the same width as the internal width of the device 101, occupying an entire width of the internal chassis of the device 101. For example, as shown in top view 150, the heatsink extends from sidewall 151 to sidewall 152 of the enclosed chassis of the device 101.

A height 117 of the heatsink 115 is shown in FIG. 1A, where the height 117 is less than the height of the device 101, leaving a headspace 118 above the heatsink 115 within a chassis of the device 101. In some examples, this headspace allows for cooling airflow to cool the components 120 in a second configuration. However, in the first or PSI configuration shown in FIGS. 1A and 1B, the cooling airflow is primarily directed into the heatsink 115.

The louver 105 in the first position prevents cooling airflow from entering the headspace 118 and instead directs substantially all of the cooling air 132 through the heatsink 115. For example, the path 130 provides an air path for cooling air 132 to flow from the side 112 and the components 120 through the heatsink 115 and to the side 111 as heated exhaust 133. In the PSI configuration shown in FIGS. 1A and 1B, the cooling air traveling along the path 130 ensures that the device 101 overall remains within safe and optimal operating temperatures via heatsink 115 and that the components 120 remain within safe and optimal operating temperatures via the cooling air 131.

In some examples, when airflow is reversed in device 101, that is cooling air enters the heatsink 115 prior to encountering the components 120, the exhaust from the heatsink 115 may not have a low enough temperature to maintain optimal or safe operating temperatures for the components 120. Some solutions, such as increasing an airflow rate of the cooling air in the device 101, increase the fan noise and other requirements of the device 101 with marginal improvements in the cooling capacity provided to the components 120. In some more optimal examples described herein, the airflow control louver is activated into a second position in order to provide cooling air directly to components 120 as descried in FIGS. 2A and 2B.

FIGS. 2A and 2B illustrate the device 101 with the louver 105 in the second position. FIG. 2A is a side view 200 of the device 101 and FIG. 2B is a top view 250 of the device 101. In some examples, the device 101, as shown in FIG. 2A, is installed within a server rack in a port side air exhaust or PSE configuration, where cooling air is drawn into the device 101 via a back side of the device 101 as described in more detail in relation to FIG. 6. The PSE configuration provides a cooling flow to a back side of the device 101, side 111, which in turn provides a cooling airflow to the heatsink 115 before cooling the components 120 on the port side of the device.

In this example, the side 112 is the exhaust side when the airflow control louver is in the second position. In the second or PSE configuration, cooling air 231 enters the device 101 on the back side of the device 101, via an air intake on the side 111 and a portion of the cooling air 231, cooling air 232*a*, travels along a third airflow path in a second direction, path 240, through the heatsink 115. Heat transfers from the heatsink 115 to the cooling air 232*a*. In some examples, the second direction of the third airflow in the second direction flows in an opposite direction of the first airflow path, path 130, described in FIG. 1.

In some examples, exhaust 233 from the heatsink 115 has an ambient temperature that is too warm to properly cool the components 120, thus relying on the exhaust 233 for cooling the components 120 may cause the components 120 to overheat and malfunction. In order to maximize cooling efficiency in the device 101 a second portion of the cooling air 231 should be provided directly to the components 120.

The louver 105 is positioned in the device 101 to direct or allow the cooling airflow along a path 240 including allowing a portion of the cooling air 231, i.e. cooling air 232*b*, to bypass the heatsink via the headspace 118 and provide a direct cooling airflow to the components 120. At a time when there is no airflow through the device 101, gravitational forces act on the louver 105 to position the louver in the first position as shown in FIGS. 1A-1B, however, as airflow begins passing along the path 240, the airflow moves the louver 105 into the second position adjacent to a top side of the device 101 by positive air pressure as discussed in relation to FIG. 3B. The louver 105, in the second position allows for the cooling air 232*b* to bypass the heatsink and provide cooling airflow to the components 120. In some examples, the cooling air 232*b* mixes with the exhaust 233 from the heatsink 115, where the mix of the exhaust 233 and the cooling air 232*b* provides enough cooling flow to ensure that the components 120 continue to function properly and not overheat.

For example, the louver 105 in the second position does not block cooling airflow from entering the headspace 118 and instead provides a path for the cooling air 232*b* to pass above or otherwise bypass the heatsink 115. For example, the path 130 provides an air path for cooling air 232*a* to flow from the side 111 through the heatsink 115 to the side 112 as heated exhaust 233. In the PSE configuration shown in FIGS. 2A and 2B, the cooling air traveling along a second airflow path in the second direction, path 230, ensures that the device 101 overall remains within safe and optimal operating temperatures via the heatsink 115. Additionally, the path 240 provides an air path for cooling air 232*b* to flow from the side 111 to the components 120 to provide cooler air than the exhaust 233 can provide to the heat sensitive components, ensuring that the components 120 remain within safe and optimal operating temperatures via the cooling air 232*b* and outputting the exhaust 235 from the device 101. Additional details for the first and second positions of the louver 105 are described in relation to FIGS. 3A-4C.

FIG. 3A further illustrates airflow in the electronic device in a first configuration in a side view 300. As shown in FIG. 3A, the cooling air 132 is shown as airflow portions 301 and 302. The airflow portion 302 acts on the louver 105 which holds or seals the louver 105 against the heatsink 115. In some examples, the louver 105 is held or sealed against a fin of the heatsink 115. As cooling air flows through the device 101, the portions 301 and 302 pass through the heatsink 115 as the heated air or exhaust 310.

FIG. 3B further illustrates airflow in the electronic device in a second configuration in a side view 350. For example, the cooling air 231 is shown as airflow portions 351 and 352. The airflow portions 352 pass through the heatsink 115 and is passed through the heatsink 115 as exhaust 355. The airflow portion 352 acts on the louver 105 and opens the louver allowing the portions 352 to bypass the heatsink 115. In some examples, the portions 352 and the exhaust 355 mix prior to airflow 360 flowing to the components 120 shown in FIGS. 2A-2B. In some examples, the airflow 360 has a higher ambient temperature than the cooling air 231; however, the airflow 360 has a lower ambient temperature than the exhaust 355 and provides a sufficient cooling airflow to the components 120.

FIG. 4A illustrates a side view of the louver 105 in the second position in a side view 400. In some examples, the louver 105 is formed from a 38 gauge or 0.15 millimeter stainless steel alloy. The louver 105 may also be formed from carbon steel and rolled to include a hinge portion of the louver 105. In some examples, the louver 105 is mounted to the top side 113 of the device 101. For example, the hinge portion is mounted on a rod or one or more mounting pieces or lances 405 and the one or more lances 405 are connected to the top side 113 via mounts 410. The louver 105 freely rotates about the lances 405 moving from the second position shown in FIG. 4A to the first position shown in FIG. 4B when no airflow is present or the device 101 is installed in the first/PSI configuration.

While shown in FIGS. 1A, 2A, and 4A-4B as mounted directly to the top side 113 of the device 101, the louver 105 and associated mounting components may be mounted to various other portions of the electronic device. For example, the device 101 may include various other components positioned above or around the heatsink. The louver 105 may be mounted to the additional component while preventing or allowing the air to enter the headspace above the heatsink, as described herein. In some examples, a weight of the louver 105 is such that the louver 105 may be moved between the two positions by airflow.

Figure 4B:
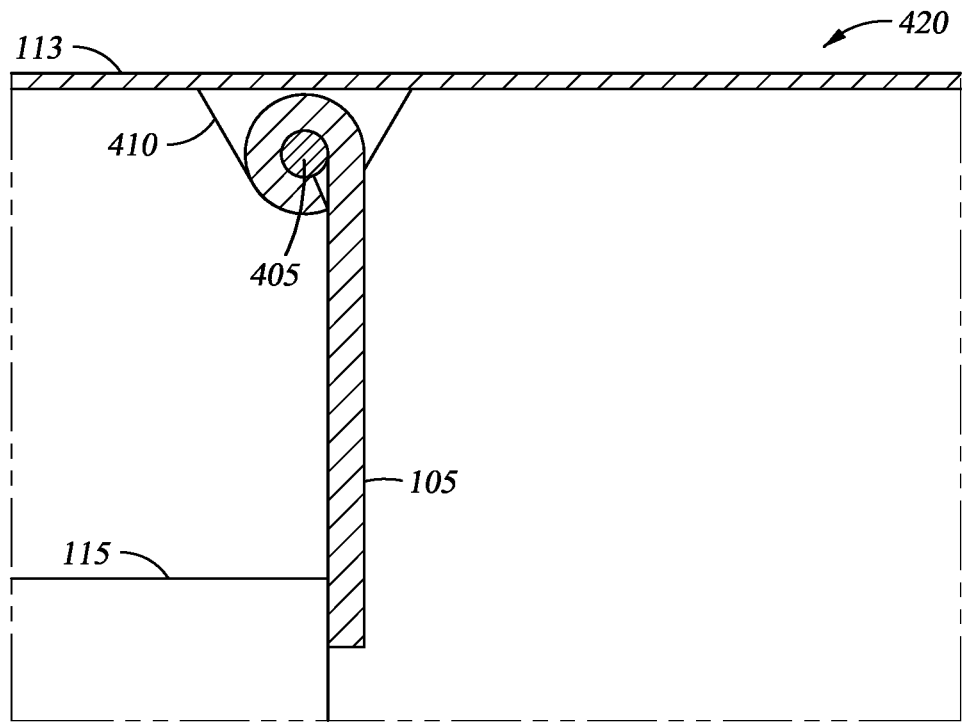

FIGS. 4B and 4C illustrate the louver in the first position. As described above, the louver 105 is in the first position in side view 420 shown in FIG. 4B, where the louver 105 has freely swung down to the first position. FIG. 4C shows front view 440 of the louver 105 in the first position, where the louver 105 is a same or approximately same width as the heatsink 115 and makes contact with the heatsink 115 in the first position.

Figure 5:
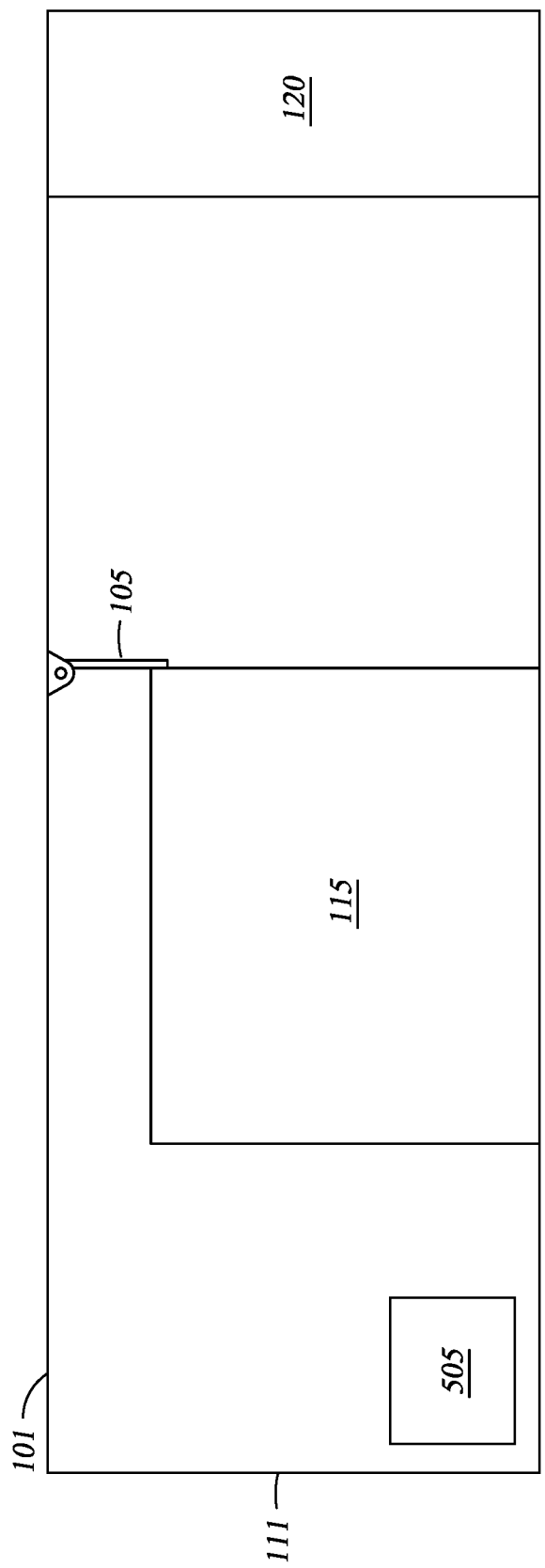
FIG. 5 illustrates an electronic device with a fan, according to one embodiment.

FIG. 5 illustrates the device 101 with a fan 505. In some examples, the fan 505 is positioned within the device 101 between the heatsink 115 and the side 111. In some examples, the fan, in a first mode, pulls air through the device 101 when the device is installed in the first configuration and, in a second mode, pushes air through the device 101 when the device is installed in the second configuration as described in more detail in FIG. 6. While shown in FIG. 5 in one example position, the fan 505 may be positioned at any position, within or outside of the device 101, where the fan 505 moves air through the device 101 as described in relation to FIGS. 1A-4C.

Figure 6:
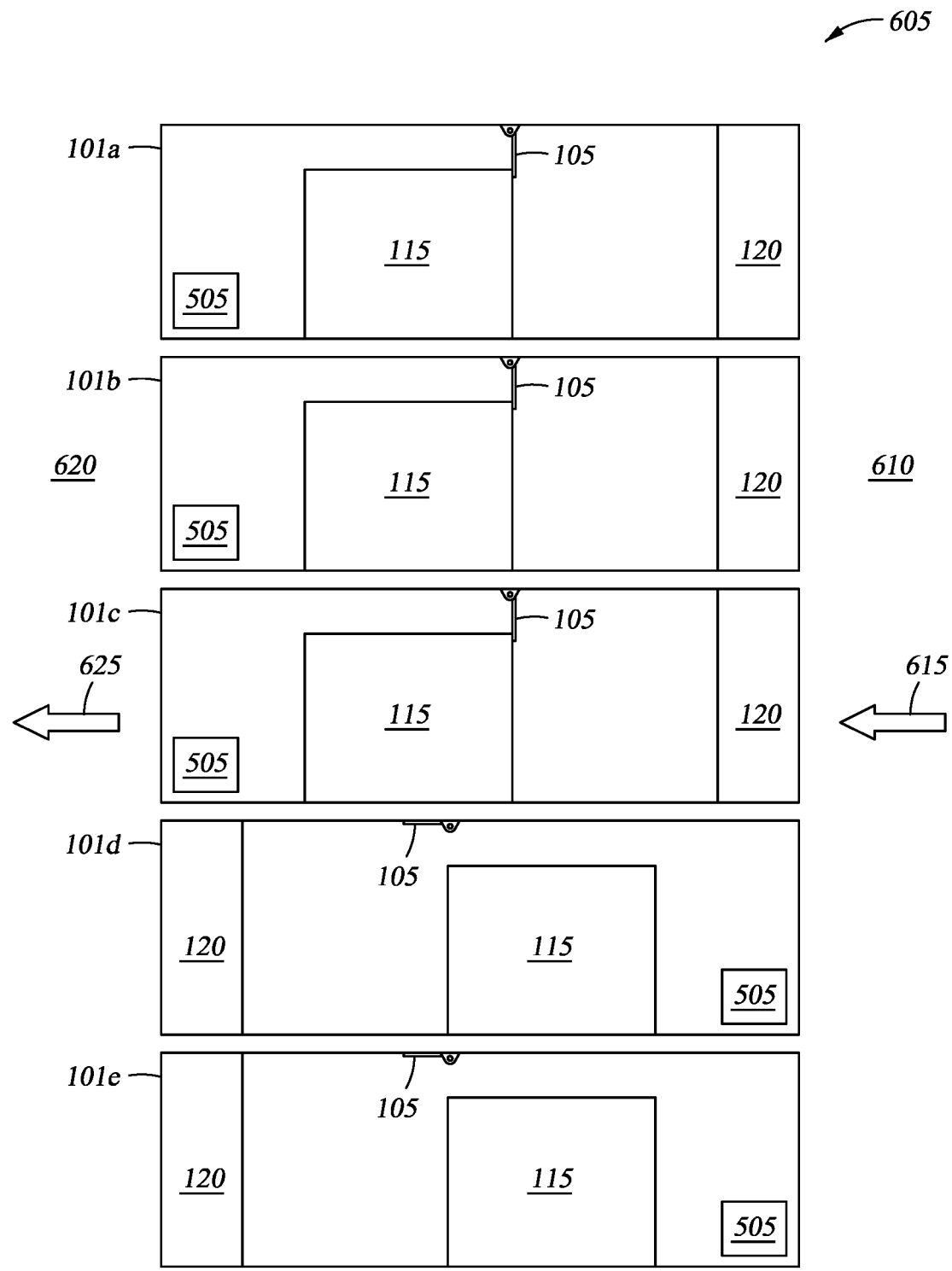
FIG. 6 illustrates electronic devices mounted in a server rack, according to embodiments.

FIG. 6 illustrates a server rack 605. In some examples, the server rack 605 is installed in a data center with a typical floor layout where a first side of the server rack 605 faces a cool air aisle 610 and second side of the server rack 605 faces a warm air aisle 620. Devices 101a-101e installed in the server rack draw cooling air 615 via the cool air aisle 610 and exhaust heated air 625 into the warm air aisle 620. In some examples, the devices 101a-101c are installed in the rack 605 in the first configuration or PSI configuration where the respective fans 505 draw air along the paths 130 within the individual systems, as shown in FIGS. 1A-1B, and output exhaust air into the warm air aisle 620. In some examples, the devices 101d-101e are installed in the rack 605 in the second configuration or PSE configuration where the respective fans 505 push air along the paths 230 and 240 as shown in FIGS. 2A-2B and output exhaust air into the warm air aisle 620.

In both of the optional configurations, the devices 101a-101e with the associated airflow control louver systems installed within the devices, provide the required heat dissipation via cooling airflow for both primary heatsinks in the devices as well as other heat sensitive components in the devices, despite which direction or configuration the devices are installed within the rack 605.

In the current disclosure, reference is made to various embodiments. However, the scope of the present disclosure is not limited to specific described embodiments. Instead, any combination of the described features and elements, whether related to different embodiments or not, is contemplated to implement and practice contemplated embodiments. Additionally, when elements of the embodiments are described in the form of "at least one of A and B," it will be understood that embodiments including element A exclusively, including element B exclusively, and including element A and B are each contemplated. Furthermore, although some embodiments disclosed herein may achieve advantages over other possible solutions or over the prior art, whether or not a particular advantage is achieved by a given embodiment is not limiting of the scope of the present disclosure. Thus, the aspects, features, embodiments and advantages disclosed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

We claim:

1. An electronic device comprising:
    a heatsink;
    a first airflow path in a first direction, wherein the first airflow path passes through the heatsink;
    a second airflow path in a second direction different from the first direction, wherein the second airflow path passes through the heatsink;
    a third airflow path in the second direction, wherein the third airflow path bypasses the heatsink; and
    an airflow control louver configured to, when in a first position, to direct cooling air along the first airflow path and, when in a second position, allow cooling air to flow along the second airflow path and the third airflow path.

2. The electronic device of claim 1, further comprising:
    an enclosed chassis, wherein the heatsink is positioned within the enclosed chassis;
    at least one heat sensitive component positioned within the enclosed chassis;
    a first air intake positioned on a first end of the enclosed chassis, wherein the first airflow path flows from the first air intake through the heatsink; and
    a second air intake positioned on a second end of the enclosed chassis, where the second end is positioned on an opposite side of the enclosed chassis from the first end, wherein the second airflow path flows from the second air intake through the heatsink, wherein the third airflow path flows from the second air intake to the at least one heat sensitive component.

3. The electronic device of claim 2,
    wherein the airflow control louver is mounted to at least one mounting piece, wherein the at least one mounting piece positions the airflow control louver adjacent to a top side of the enclosed chassis, and wherein the airflow control louver rotates freely on the at least one mounting piece.

4. The electronic device of claim 2,
    wherein the at least one heat sensitive component is positioned within the enclosed chassis and adjacent to the first end of the enclosed chassis,
    wherein the first airflow path provides a first cooling airflow to the at least one heat sensitive component, wherein the at least one heat sensitive component is cooled by the first cooling airflow in the first airflow path prior to the first cooling airflow passing through the heatsink,
    wherein the second airflow path provides a second cooling airflow to the heatsink, wherein the heatsink is cooled by the second cooling airflow in the second airflow path prior to flowing towards the at least one heat sensitive component, and
    wherein the third airflow path provides a direct cooling airflow to the at least one heat sensitive component by bypassing the heatsink.

5. The electronic device of claim 2, wherein the heatsink is positioned within the enclosed chassis to occupy an internal width of the enclosed chassis, and wherein the heatsink is positioned within the enclosed chassis to provide a headspace above the heatsink within the enclosed chassis to provide a bypass for the third airflow path.

6. The electronic device of claim 2, wherein the at least one heat sensitive component comprises an application-specific integrated circuit (ASIC).

7. The electronic device of claim 1, wherein the airflow control louver is a passive activation louver,
    wherein when there is no airflow through the electronic device the airflow control louver is in the first position,
    wherein when airflow is activated in the first direction the airflow control louver is in the first position and sealed against the heatsink by positive air pressure from the airflow in the first direction,
    wherein when airflow is activated in the second direction, the airflow control louver is in the second position, wherein the airflow in the second direction moves the airflow control louver to the second position, wherein the second direction is opposite the first direction.

8. The electronic device of claim 1, further comprising:
    a fan,
        wherein the fan in a first mode provides airflow in the first direction, and
        wherein the fan in a second mode provides airflow in the second direction.

9. The electronic device of claim 8, wherein the electronic device is installed within a server rack, wherein the electronic device is installed in the server rack in a port side intake (PSI) configuration the fan operates in the first mode, and
wherein when the electronic device is installed in a port side exhaust (PSE) configuration the fan operates in the second mode.

10. An network switch comprising:
a heatsink;
at least one optical network component;
a first airflow path in a first direction, wherein the first airflow path passes through the heatsink;
a second airflow path in a second direction, wherein the second airflow path passes through the heatsink;
a third airflow path in the second direction, wherein the third airflow path bypasses the heatsink to flow to the at least one optical network component; and
an airflow control louver, wherein the airflow control louver in a first position directs cooling air along the first airflow path, and wherein the airflow control louver in a second position allows cooling air to flow along the second airflow path and the third airflow path.

11. The network switch of claim 10, further comprising:
an enclosed chassis, wherein the heatsink is positioned within the enclosed chassis;
a first air intake positioned on a first end of the enclosed chassis, wherein the first airflow path flows from the first air intake through the heatsink; and
a second air intake positioned on a second end of the enclosed chassis, where the second end is positioned on an opposite side of the enclosed chassis from the first end, wherein the second airflow path flows from the second air intake through the heatsink, wherein the third airflow path flows from the second air intake to the at least one optical network component.

12. The network switch of claim 11,
wherein the airflow control louver is mounted to at least one mounting piece, wherein the at least one mounting piece positions the airflow control louver adjacent to a top side of the enclosed chassis, and wherein the airflow control louver rotates freely on the at least one mounting piece.

13. The network switch of claim 11,
wherein the at least one optical network component is positioned within the enclosed chassis and adjacent to the first end of the enclosed chassis,
wherein the first airflow path provides a first cooling airflow to the at least one optical network component, wherein the at least one optical network component is cooled by the first cooling airflow in the first airflow path prior to the first cooling airflow passing through the heatsink,
wherein the second airflow path provides a second cooling airflow to the heatsink, wherein the heatsink is cooled by the second cooling airflow in the second airflow path prior to flowing towards the at least one optical network component, and
wherein the third airflow path provides a direct cooling airflow to the at least one optical network component by bypassing the heatsink.

14. The network switch of claim 11, wherein the heatsink is positioned within the enclosed chassis to occupy an internal width of the enclosed chassis, and wherein the heatsink is positioned within the enclosed chassis to provide a headspace above the heatsink within the enclosed chassis to provide a bypass for the third airflow path.

15. The network switch of claim 10, wherein the airflow control louver is a passive activation louver, wherein when there is no airflow through the network switch the airflow control louver is in the first position,
wherein when airflow is activated in the first direction the airflow control louver is in the first position and sealed against the heatsink by positive air pressure from the airflow in the first direction,
wherein when airflow is activated in the second direction, the airflow control louver is in the second position, wherein the airflow in the second direction moves the airflow control louver to the second position, wherein the second direction is opposite the first direction.

16. The network switch of claim 10, further comprising:
a fan,
wherein the fan in a first mode provides airflow in the first direction, and
wherein the fan in a second mode provides airflow in the second direction.

17. The network switch of claim 16, wherein the network switch is installed within a server rack,
wherein the network switch is installed in the server rack in a port side intake (PSI) configuration the fan operates in the first mode, and
wherein when the network switch is installed in a port side exhaust (PSE) configuration the fan operates in the second mode.

18. An airflow control louver system comprising:
an airflow control louver positioned within an enclosed electronic device;
a first airflow path in a first direction and through a heatsink of the enclosed electronic device;
a second airflow path in a second direction and through the heatsink of the enclosed electronic device; and
a third airflow path in the second direction and bypassing the heatsink of the enclosed electronic device, wherein the airflow control louver in a first position directs cooling air along the first airflow path, and wherein the airflow control louver in a second position allows cooling air to flow along the second airflow path and the third airflow path.

19. The airflow control louver system of claim 18, further comprising:
the heatsink positioned within the enclosed electronic device;
at least one heat sensitive component positioned within the enclosed electronic device;
a first air intake positioned on a first end of the enclosed electronic device, wherein the first airflow path flows from the first air intake through the heatsink; and
a second air intake positioned on a second end of the enclosed electronic device, where the second end is positioned on an opposite side of the enclosed electronic device from the first end, wherein the second airflow path flows from the second air intake through the heatsink, wherein the third airflow path flows from the second air intake to the at least one heat sensitive component.

20. The airflow control louver system of claim 19, wherein the airflow control louver is a passive activation louver,
wherein when there is no airflow through the enclosed electronic device the airflow control louver is in the first position,
wherein when airflow is activated in the first direction the airflow control louver is in the first position and sealed against the heatsink by positive air pressure from the airflow in the first direction, wherein when airflow is activated in the second direction, the airflow control louver is in the second position, wherein the airflow in the second direction moves the airflow control louver to the second position wherein the second direction is opposite the first direction.

\* \* \* \* \*